(12) United States Patent
Chau et al.

(10) Patent No.: US 7,078,282 B2
(45) Date of Patent: Jul. 18, 2006

(54) REPLACEMENT GATE FLOW FACILITATING HIGH YIELD AND INCORPORATION OF ETCH STOP LAYERS AND/OR STRESSED FILMS

(75) Inventors: Robert S. Chau, Beaverton, OR (US); Justin K. Brask, Portland, OR (US); Chris E. Barns, Portland, OR (US); Scott A. Hareland, Lino Lakes, MN (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 10/749,196

(22) Filed: Dec. 30, 2003

(65) Prior Publication Data

US 2005/0145894 A1    Jul. 7, 2005

(51) Int. Cl.
*H01L 21/338* (2006.01)
(52) U.S. Cl. ........................................ 438/183
(58) Field of Classification Search ................ 438/183
See application file for complete search history.

(56) References Cited

U.S. PATENT DOCUMENTS

| | | | |
|---|---|---|---|
| 4,352,724 A * | 10/1982 | Sugishima et al. .... | 204/192.37 |
| 5,960,270 A | 9/1999 | Misra et al. | |
| 6,015,727 A | 1/2000 | Wanlass | |
| 6,071,784 A | 6/2000 | Mehta et al. | |
| 6,146,954 A * | 11/2000 | Klein et al. | |
| 6,475,908 B1 * | 11/2002 | Lin et al. ..................... | 438/659 |
| 6,660,598 B1 * | 12/2003 | Hanafi et al. ............... | 438/291 |
| 6,677,652 B1 * | 1/2004 | Lin et al. ..................... | 257/407 |
| 6,686,630 B1 * | 2/2004 | Hanafi et al. ............... | 257/366 |
| 6,841,831 B1 * | 1/2005 | Hanafi et al. ............... | 257/369 |
| 6,858,502 B1 | 2/2005 | Chu et al. | |
| 6,861,350 B1 * | 3/2005 | Ngo et al. ................... | 438/627 |
| 2002/0094647 A1 | 7/2002 | Woerlee et al. | |
| 2003/0011023 A1 | 1/2003 | Hurley | |
| 2003/0215999 A1 | 11/2003 | Chern et al. | |

OTHER PUBLICATIONS

International Search Report PCT/US2004/044077.

* cited by examiner

*Primary Examiner*—David S. Blum
(74) *Attorney, Agent, or Firm*—Blakely, Sokoloff, Taylor & Zafman LLP

(57) ABSTRACT

The present invention relates to the deposition of a layer above a transistor structure, causing crystalline stress within the transistor, and resulting in increased performance. The stress layer may be formed above a plurality of transistors formed on a substrate, or above a plurality of selected transistors.

26 Claims, 4 Drawing Sheets

REPLACEMENT GATE FLOW FACILITATING HIGH YIELD AND INCORPORATION OF ETCH STOP LAYERS AND/OR STRESSED FILMS

FIELD

The present invention relates to the field of semiconductors and semiconductor manufacturing; more specifically to a transistor gate electrode, its method of fabrication, reducing defects, and increasing performance.

BACKGROUND

In the effort to build integrated circuits with higher performance and increased yields a number of process technologies have emerged. One such technology improvement is the innovation of using a sacrificial gate to improve the geometry and manufacturability and performance of a gate structure. A second improvement in increasing integrated circuit performance involves processes that include an underlying strained semiconductor layer.

A typical process to form a device may consist of various steps. Known and related art may include the following steps. Using a starting wafer or substrate, a thin film layer of silicon dioxide is used to initially develop the silicon surface for processing. Next, masks, usually silicon nitride, are used to fabricate multiple layers. Chemical vapor deposition process or the equivalent may be used to define and form the active areas of the switching device, and wet etch stages may utilize phosphoric acid to subsequently remove unwanted depositions.

For MOS devices, a gate dielectric layer, and then a gate electrode are formed on a silicon base or substrate. First, the substrate surface is prepared for processing, and a well region is formed in the substrate. Next, a gate structure including a gate dielectric, sidewalls and sidewall spacers are formed. Later, implantation and oxide growth steps are generally used to develop the electrical characteristics of the various areas within a device. A source and drain region are usually formed by implantation or diffusion in the top surface of the silicon substrate after the gate formation. A sacrificial gate electrode may be removed in preparation for the deposition of the permanent gate electrode material. Further steps refining the geometry and electrical characteristics of the transistor may be performed as well as the later steps to open contact windows and the development of an interconnecting structure.

A drawback to forming a sacrificial gate structure is encountered in performing a metal polish process where a number of defects or a high defectivity rate may be introduced. Possible defects remain in and around the remaining gate structure and inter level dielectric layer.

With respect to performance enhancements of silicon switching devices, one of the recent innovations includes forming a strained substrate layer on an underlying substrate before forming any switching devices. Typically, a thin strained silicon layer is fabricated on a relaxed silicon germanium layer. MOS devices are then fabricated on the underlying strained silicon layer. The strained silicon layer is created by a crystalline mismatch by using a material, such as silicon germanium, with a lattice constant greater than or different than that of silicon. The lattice constant of germanium is about 4 percent greater than that of silicon. As a result, the silicon crystal is stressed when deposited on top of a substrate containing germanium. The crystalline mismatch results in the upper layers of silicon becoming strained, which creates increased hole and electron mobility within a formed silicon switch. Electrons passing through the stressed silicon experience an increased flow, which results in performance increases in the switching devices formed above the stressed silicon layers.

However, a difficulty with strained silicon technology is the presence of the relaxed silicon germanium layer under the strained silicon layer, where the silicon germanium layer may be affected by various processing steps, such as thermal oxidation, salicide formation, and anealling during an MOS device fabrication. Another problem when forming a strained silicon layer is a subsequent exposure to elevated temperatures during later processing steps may effectively remove some or all of the crystalline strain developed in the underlying silicon layer.

DETAILED DESCRIPTION

A novel transistor structure and its method of fabrication is described. A sacrificial gate is generally employed in semiconductor processes during the implant process in forming the source, drain and channel. The inventive process includes the formation of a sacrificial gate structure, the integration of a replacement gate, and using polish and wet etch steps to reduce defects prior to the deposition of an etch stop and/or stress inducing layer. Also, replacement gate electrodes are likely candidates for implementing metal as the gate electrodes. The transistor of the present invention includes forming a layer over the transistor structure that creates a stress in the underlying structure.

Figure 1:
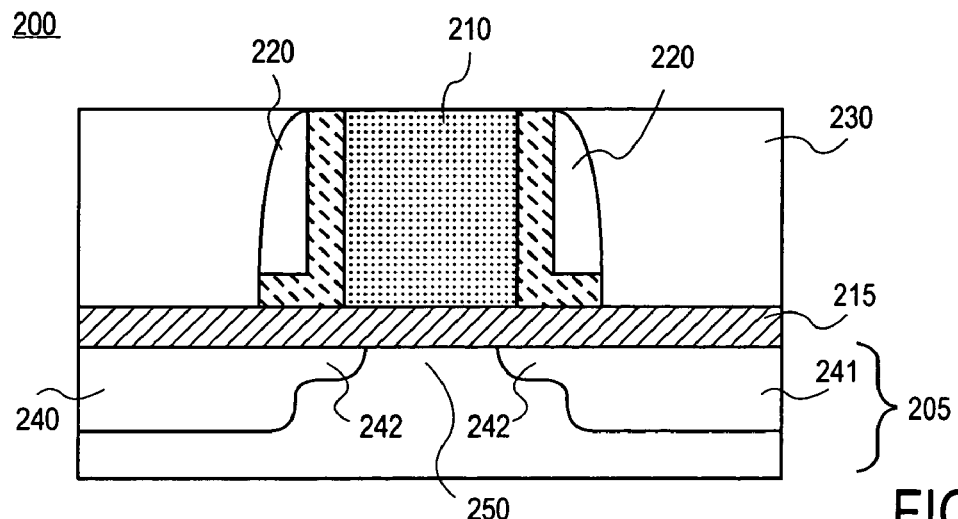
FIG. 1 illustrates a sacrificial gate stack after a gate dielectric and gate electrode have been formed.

In one embodiment, a transistor is constructed using a sacrificial gate. FIG. 1 illustrates a transistor structure having a sacrificial gate structure. The sacrificial gate structure is formed above a substrate 205. The substrate is generally a silicon wafer. A gate dielectric 215, and sacrificial gate electrode 210, are formed above the substrate 205. The gate dielectric 215 may be grown on the substrate 205 by thermal oxidation of the substrate, by chemical vapor deposition (CVD) or other techniques. The sacrificial gate electrode 210 may be made of a variety of materials including polysilicon or silicon dioxide ($SiO_2$).

After a sacrificial gate structure is formed on the substrate, doping or implantation steps are used to develop the electrical characteristics of various areas within the transistor. Source and drain extensions or tips 242, are formed to enhance the transistor breakdown voltage, defining a channel region 250, approximately between the gate and source/drain regions.

After the formation of the extension regions 242, side wall spacers 220 are formed on the sides of the sacrificial gate 210, conforming to the profile height of the sacrificial gate electrode 210. Sidewall spacers are normally a nitride or oxide, and formed by thermal oxidation or by a chemical vapor deposition CVD process. Examples of sidewall spacer materials are silicon nitride, carbon doped nitride, or carbon doped nitride without oxide components.

The remaining portions of the source and drain regions 240/241 are formed by implantation or highly doping the region, with the gate and sidewall spacers acting as a barrier. An annealing process is applied after implantation to activate the implanted dopants and to repair any implantation damage. The anneal process may be carried out at a low thermal budget (e.g. high temperature for a short time) to avoid dopant redistribution.

Next, the blanket deposition of a sacrificial inter-layer dielectric film followed by a polish process to planarize and expose the gate electrode is performed. In FIG. 1, after the gate dielectric 215, sacrificial gate electrode 210, gate sidewall spacers 220, source/drain regions 240/241 and channel 250, have been developed, a sacrificial inter level dielectric layer (ILD0) 230 is blanket deposited over the substrate and gate structure. The sacrificial ILD0 layer 230 may be further processed, using a chemical or mechanical polishing technique, to planarize the sacrificial ILD0 layer, and to expose the top surface of the sacrificial gate 210.

Figure 2:
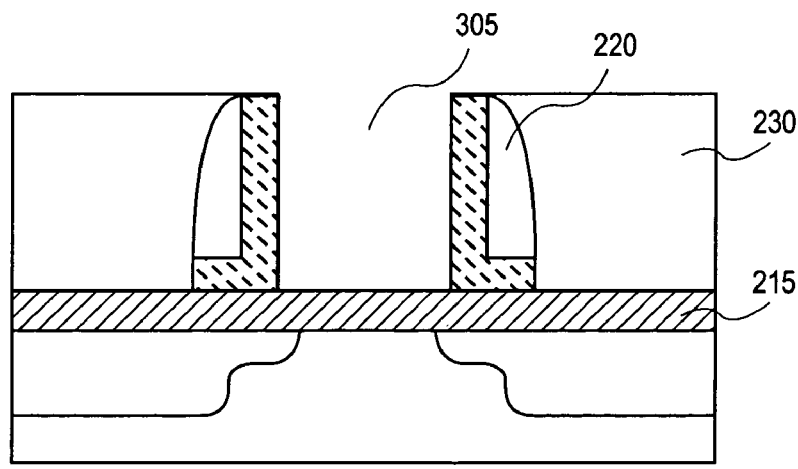
FIG. 2 illustrates the structure as shown in FIG. 1, after the sacrificial gate has been removed, leaving a trench for subsequent gate processing. The sacrificial inter level dielectric remains.

Next, the sacrificial gate stack is etched away as illustrated in FIG. 2. The sacrificial gate electrode is removed in preparation for the deposition of a permanent gate electrode. The etch process should provide a selectivity that leaves the gate sidewall spacers 220 and sacrificial inter level dielectric layer (ILD0) 230 intact. Etch materials are chosen to selectively etch the sacrificial gate material at a much higher rate than the sidewall spacers. Etch selectivity is preferred to be in the range of approximately 10:1 or greater. In one embodiment, for maximum selectivity, an etch time of approximately 30 minutes at room temperature, 20 to 30 degrees Centigrade, is used.

a) In one embodiment, the sacrificial gate is removed by a wet etch process, for example, when the sacrificial gate 210 is polysilicon, an etchant such as ammonium hydroxide or an HF/nitric acid mixture may be used.

b) In another embodiment, when the sacrificial gate 210 is a silicon nitride, an etchant such as a phosphoric acid etch may be used.

c) In another embodiment, when the sacrificial gate 210 is an oxide, an etchant such as hydrofluoric acid may be used.

In FIG. 2, the etch process removes the sacrificial gate, and leaves a trench 305, between the sidewall spacers 220 that will be subsequently filled by a replacement gate. In one embodiment, the gate dielectric 215 will remain.

Figure 3:
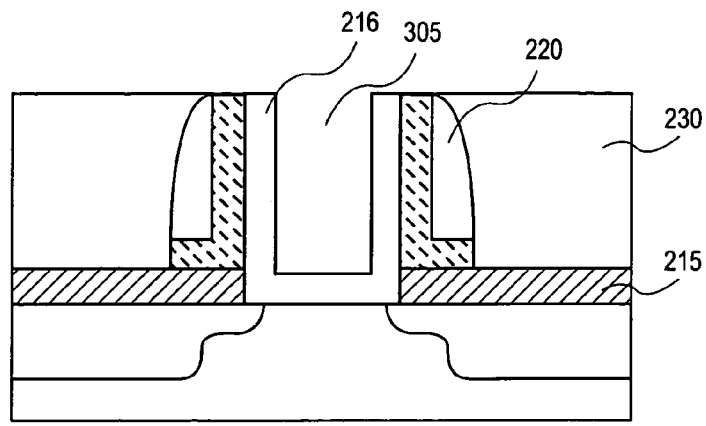
FIG. 3 illustrates the structure as shown in FIG. 1, after the sacrificial gate and gate dielectric have been removed, leaving a trench for subsequent gate processing. A replacement gate dielectric has been deposited. The sacrificial inter level dielectric remains.

In another embodiment, as shown in FIG. 3, when the sacrificial gate is removed, the gate dielectric (oxide) 215 located between the sidewall spacers 220, may also be removed. In this embodiment, the replacement gate process will include a conformal deposition of the trench 305, of a new gate dielectric 216, such as but not limited to a high-k material including: $HfO_2$, $ZrO_2$, $Al_2O_3$, $Ta_2O_5$, $TiO_2$, $La_2O_3$. The replacement gate dielectric may be grown by thermal oxidation of the base substrate, by other techniques such as chemical vapor deposition (CVD) or atomic layer deposition (ALD). After the new gate dielectric layer has been deposited, it may optionally be annealed or subjected to a remote plasma nitridization (RPN) or other post-oxide growth treatments. The structure is then processes as further described below.

Figure 4:
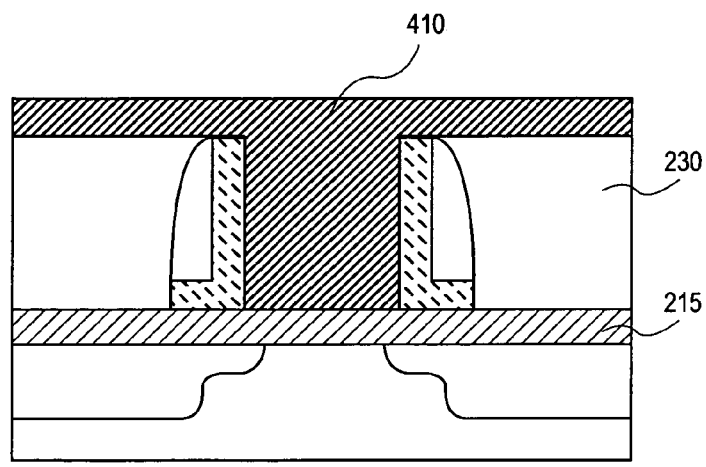
FIG. 4 illustrates the gate stack shown in FIG. 3 after depositing the replacement gate electrode prior to polishing.

Next, a replacement gate deposition is performed. FIG. 4 illustrates a replacement gate process. The replacement gate electrode 410 is deposited to fill the recess or trench and is also deposited over the sacrificial inter level dielectric layer (ILD0) 230. The replacement gate may be grown using a number of processes, for example thermal oxidation, chemical vapor deposition, atomic layer or polysilicon deposition. Replacement gate material may be polysilicon, silicide, an oxide, metal, or other conductive materials. Also, the replacement gate may be a single metal or multiple metals. A replacement gate metal may be used but is not limited to, aluminum (Al), titanium (Ti), molybdenum (Mo), tungsten (W), and also metals nitrides and carbides, for example, of titanium (TiN, TiC) or tantalum (TaN, TaC).

Figure 5:
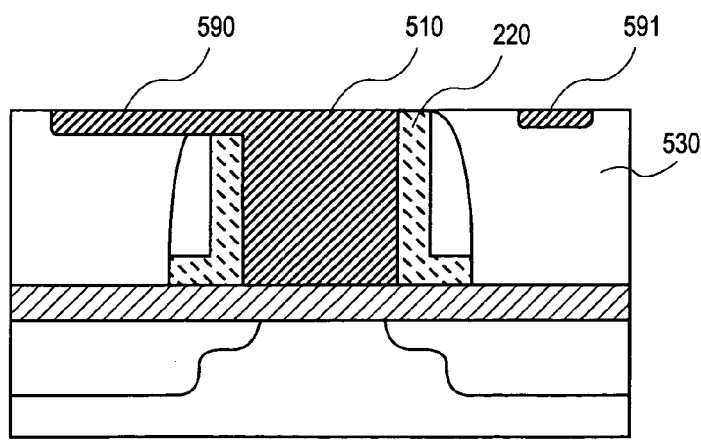
FIG. 5 illustrates the gate stack shown in FIG. 4 after polishing, illustrating polish non-uniformities.

Next, a polish process is performed. FIG. 5 illustrates the structure after the gate electrode has been polished. In FIG. 5, the top of the replacement gate structure is exposed to a polishing process to planarize the surface and expose the gate electrode. After the replacement gate electrode is deposited over the recess or trench, a polish is performed to remove any unwanted metal, leaving the trench filled, the gate electrode exposed 510, and the structure planarized. The polish process is typically selective to the sidewall spacers and sacrificial inter level dielectric (ILD0) to retain the vertical dimension of the gate. Polishing the sacrificial inter-level dielectric layer and the replacement gate electrode typically will remove less than 50 Angstroms of the replacement gate height. However, polishing and planarization of the metal gate electrode 510, can result in dishing or other polish non-uniformities that leave stringers, which can have a significant impact on yield. FIG. 5 illustrates possible defect modes that result from the polishing process, which include metal smearing 590, deposition in pits or dished out regions 591 of the sacrificial ILD0 530. These can result from scratches, divots, or topography attributed to over-polish during the initial sacrificial ILD planarization down to the gate electrode 510 and sidewall spacers.

Next, an etch process is then used to remove the polish defects. Utilizing a sacrificial inter level dielectric layer reduces defects resulting from the polishing process. The sacrificial ILD0 layer and remaining polish defects are now selectively removed by using a wet etch process. The removal of polishing defects provides higher overall yields.

Figure 6:
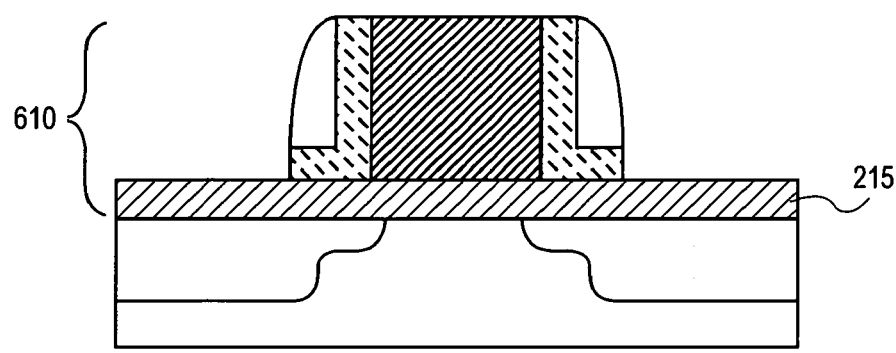
FIG. 6 illustrates the gate stack shown in FIG. 5 after an etch removal of the sacrificial inter-level dielectric layer.

The previous polish process exposes the sacrificial inter level dielectric (ILD0) to make the etch process effective. In FIG. 6, a wet etch removal of the sacrificial inter level dielectric (ILD0) layer exposes the transistor structure 610, and also has the additional benefit of lifting-off unwanted metal stringers or defects such as those illustrated in FIG. 5. For metal filled pits, dished areas, and metal smears, the wet etch removal of the sacrificial ILD0 acts as a liftoff layer to remove these unwanted metallic defects in preparation for the deposition of the next layer.

Etch materials are chosen to etch the sacrificial ILD0 at much higher rate than other features. A wet etch process is used that is selective to the sacrificial ILD0, without etching the spacers, metal gate, and in addition, the bulk substrate, other features such as shallow trench isolation (STI) areas, or salicide covered diffusions. Etch selectivity is preferred to be in the range of approximately 10:1 or greater. The wet etch removal process removes under 10 Angstroms of height from the replacement gate electrode. In one embodiment, for maximum selectivity, an etch time of approximately 2 minutes to 5 minutes at room temperature, 20 to 30 degrees Centigrade, is used.

a) In one embodiment, a stoichiometric silicon nitride sacrificial ILD0 is used with a carbon doped nitride spacer without oxide components.

b) In another embodiment, a soft chemical vapor deposition (CVD) oxide sacrificial ILD0 is used with a silicon nitride or carbon doped nitride spacer.

c) In the embodiment using a carbon doped nitride spacer, the sacrificial ILD0 layer can be removed with conditioned phosphoric acid.

d) In the embodiment using a silicon nitride or carbon doped nitride spacer, a buffered Hydrofluoric Acid (HF) solution, alternately used with surfactants such as ethylene glycol, can be used to remove the sacrificial ILD0 layer.

e) Other isotropic or anisotropic etch processes may also be used.

In an alternate embodiment, a very short metal etch could be used to remove remaining feather defects along the top of the gate stack, for example using a titanium nitride etch in a sulfuric acid and hydrogen peroxide mixture, at 70 degrees Centigrade, will etch at a rate of approximately 60 Angstroms per minute.

Figure 7:
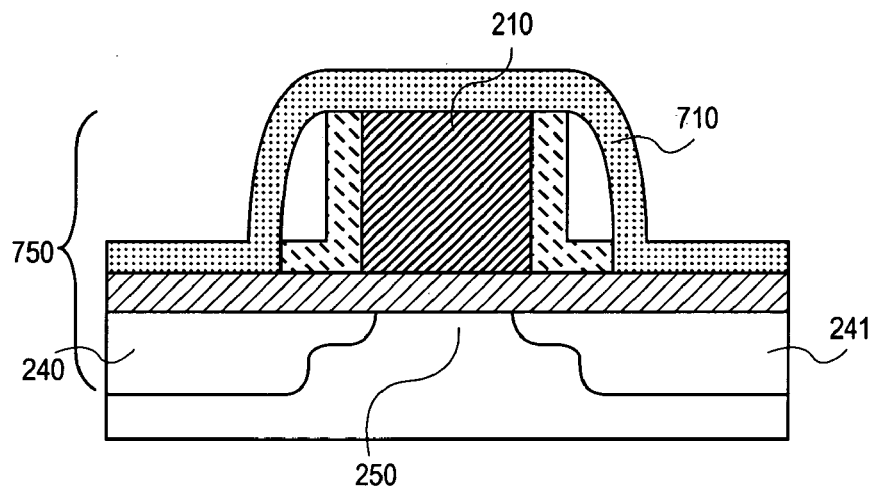
FIG. 7 illustrates a gate structure after depositing an nitride etch stop layer (NESL).

After the sacrificial inter level dielectric is removed, the transistor is now exposed and the metal defects lifted-off the structure as illustrated in FIG. 6. A nitride etch stop layer (NESL) and/or stress-inducing film layer is now added above the transistor. In one embodiment, the gate dielectric 215 remains as illustrated. In the embodiment as shown in FIG. 3, the structure continues to be similarly processed. FIG. 7 illustrates one embodiment of the inventive structure containing a straining NESL layer 710. The NESL 710, is formed above the transistor structure 750.

The nitride etch stop layer (NESL) 710, creates stress in the channel 250, source 240, and drain 241 portions of the transistor. Using a transistor 750, as shown, but including subsequently formed features, when a charge of the correct polarity is applied to the gate electrode 210, the channel region 250 electrically inverts and becomes a conductive path between the source 240 and drain 241 regions. The NESL 710, formed above the gate structure 210, generates stress in the underlying transistor which increases the electron and/or hole mobility, resulting in an approximate 10 to 20 percent performance increase.

In one embodiment, the deposition of the nitride etch stop layer (NESL) is performed using a chemical vapor deposition process using silane and nitrogen. Other equivalent deposition processes may also be used. The NESL layer may be a blanket deposition over an entire substrate or alternately, the NESL may be selectively formed over individual devices or transistors. The NESL deposition can also be formed at temperatures close to or less than 400 degrees Centigrade for relatively short periods of time, for example, approximately 1 minute, enabling successful integration with any thermally sensitive metal replacement gate electrode candidates.

In one embodiment, the thickness for the nitride etch stop layer (NESL) is approximately 500 Angstroms. However, a range of 100 to 1200 Angstroms will also induce stress within the underlying transistor to improve performance. In another embodiment, the NESL consists of a silicon nitride (Si3N4). Various materials to form the NESL may also be used, such as germanium, silicon germanium (SiGe), other oxides, such as carbon-doped silicon oxide, or carbon-doped silicon nitride.

Figure 8:
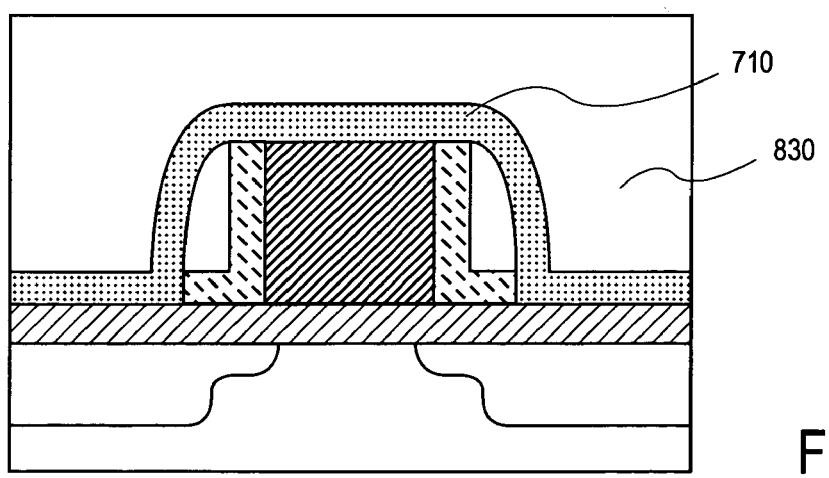
FIG. 8 illustrates the gate structure shown in FIG. 7 after an inter-level dielectric layer is deposited.

Next, as shown in FIG. 8, after the nitride etch stop layer (NESL) 710 has been deposited, a "true" inter level dielectric (ILD) layer 830, is subsequently deposited. The ILD layer may be silicon dioxide or a low k dielectric. Further processing may then continue, for example, to refine the geometry or electrical characteristics of the transistor and/or to open contact windows for the development of an interconnecting structure. In alternate embodiments, additional strained layers may be employed. In one embodiment, an etch process may be used to remove portions of a first NESL to develop interconnections with a subsequent deposition additional NESLs.

Figure 9:
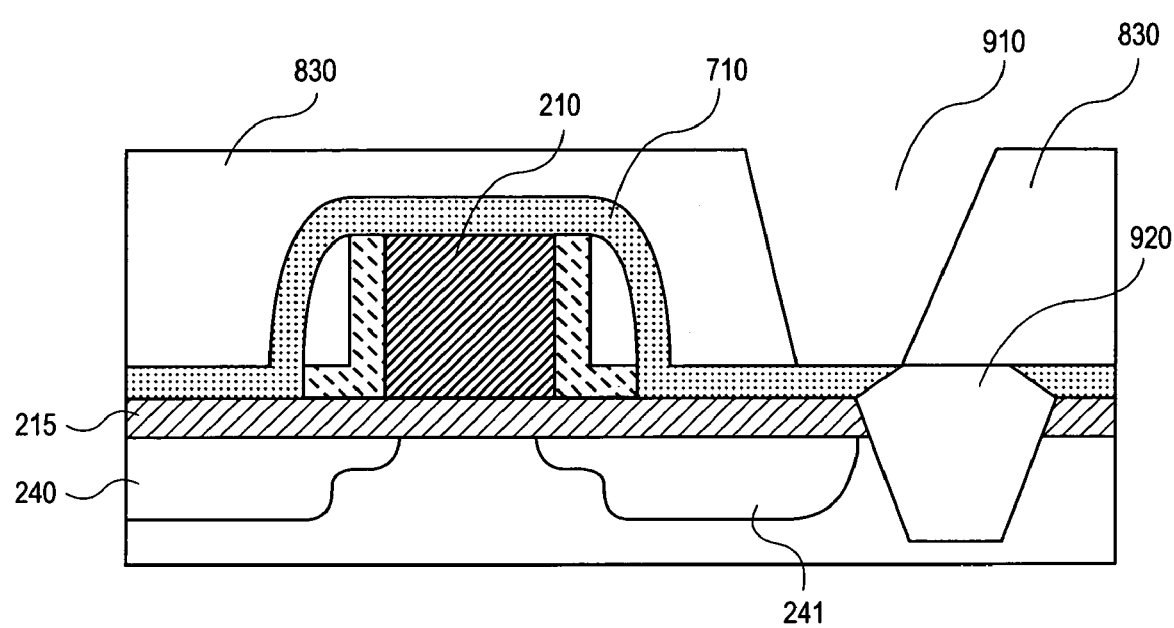
FIG. 9 illustrates a transistor structure in process, a non-landed contact window, and shallow trench isolation area.

Additionally, in one embodiment, the NESL can be deposited to subsequently enable un-landed contacts as shown in n FIG. 9. A shallow trench isolation (STI) area 920 is shown, with unlanded contact window 910. The contact window may be formed, exposing a portion of the STI, in preparation for further processing to subsequently form interconnections over the devices.

It shall be observed that the process steps and structures described herein do not form a complete process flow for manufacturing integrated circuits. The present invention can be practiced in conjunction with a variety of integrated circuit fabrication techniques, including those techniques currently used in the art. As such, commonly practiced process steps are included in the description herein only if those steps are necessary for an understanding of the present invention.

It will be obvious to those skilled in the art that various changes may be made without departing from the scope of the invention, which is not to be considered limited to what is described in the specification. It is to be understood that other embodiments may be utilized and that logical, mechanical, and electrical changes may be made without departing from the spirit and scope of present invention. In the drawings, like numerals describe substantially similar components throughout the several views.

What is claimed is:

1. A method comprising:
   forming a sacrificial gate electrode over a substrate;
   forming sidewall spacers on the sides of the sacrificial gate electrode, wherein the sidewall spacers comprise carbon doped nitride without oxide components;
   forming a sacrificial inter-level dielectric layer, wherein the sacrificial inter-level dielectric layer comprises a stoichiometric silicon nitride;
   removing the sacrificial gate electrode;
   depositing a replacement gate electrode;
   polishing the sacrificial inter-level dielectric layer and the replacement gate electrode; and
   performing a wet etch removal on the sacrificial inter-level dielectric layer.

2. The method of claim 1, wherein the wet etch removal of the sacrificial inter-level dielectric layer comprises removal with conditioned phosphoric acid.

3. The method of claim 1 wherein polishing the sacrificial inter-level dielectric layer and the replacement gate electrode removes less than 50 Angstroms of the replacement gate height.

4. The method of claim 1 wherein performing the wet etch removal removes remaining defects from the polishing the sacrificial inter-level dielectric layer and the replacement gate electrode.

5. The method of claim 1 wherein performing the wet etch removal is performed using phosphoric acid, conditioned phosphoric acid, aqueous hydrofluoric acid, a buffered hydrofluoric acid solution, or a hydrofluoric acid used with surfactants.

6. The method of claim 5 wherein the surfactant used with the hydrofluoric acid is ethylene glycol.

7. The method of claim 4 wherein the wet etch removal process is performed at a temperature of approximately 20 degrees Celsius to about 30 degrees, Celsius.

8. The method of claim 4 wherein the wet etch removal process persists for a time period of approximately 2 minutes to 5 minutes.

9. The method of claim 4 wherein the wet etch removal process has an approximate selectivity of 10:1 or greater.

10. The method of claim 1 wherein the wet etch removal removes under 10 Angstroms of height from the replacement gate electrode.

11. The method of claim 1 wherein performing the wet etch removal process of the residual gate electrode material comprises using a titanium nitride etch in a sulfuric acid and hydrogen peroxide mixture, at 70 degrees Centigrade.

12. The method of claim 11 wherein the titanium nitride etch removes the inter-level dielectric layer at a rate of approximately 60 Angstroms per minute.

13. The method of claim 1 further comprising depositing a nitride etch stop layer.

14. The method of clam 13 wherein the nitride etch stop layer creates stress in an underlying structure.

15. The method of claim 1 further comprising depositing a nitride etch stop layer creating stress in an underlying structure.

16. A method comprising:
forming a sacrificial gate electrode on a substrate;
forming sidewall spacers on the sides of the sacrificial gate electrode;
forming a sacrificial inter-level dielectric layer;
removing the sacrificial gate electrode;
depositing a replacement gate electrode;
polishing the sacrificial inter-level dielectric layer and the replacement gate electrode; and
performing a wet etch removal on the inter-level dielectric layer; and
depositing a nitride etch stop layer creating stress in the underlying structure.

17. The method of claim 16 wherein the deposition of the nitride etch stop layer is formed as a blanket deposition over an entire substrate.

18. A method of claim 16 wherein the deposition of the nitride etch stop layer is selectively formed over individual devices or transistors.

19. The method of claim 16 wherein the deposition of the nitride etch stop layer is performed using a chemical vapor deposition process using silane and nitrogen or ammonia.

20. The method of claim 16 wherein the nitride etch stop layer consists of a silicon nitride (Si3N4).

21. The method of claim 16 wherein the nitride etch stop layer is from the group consisting of germanium, silicon germanium, carbon-doped silicon oxide, and carbon-doped silicon nitride.

22. The method of claim 16 wherein the deposition of the nitride etch stop layer is approximately 100 to 1200 Angstroms thick.

23. The method of claim 16 wherein the deposition of the nitride etch stop layer is approximately 500 Angstroms thick.

24. The method of claim 16 wherein the nitride etch stop layer deposition is formed at temperatures close to or less than 400 degrees Centigrade for less than 1 minute.

25. The method of claim 24 wherein the nitride etch stop layer is compatible with temperature sensitive metal gate electrode candidates.

26. The method of claim 16 wherein an inter-level dielectric layer is deposited after the nitride etch stop layer has been deposited.

* * * * *